(12) United States Patent  (10) Patent No.: US 7,808,172 B2
Kim  (45) Date of Patent: Oct. 5, 2010

(54) ORGANIC LIGHT EMITTING DISPLAY (75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 734 days.

(21) Appl. No.: 11/730,103

(22) Filed: Mar. 29, 2007

(65) Prior Publication Data

US 2007/0228936 A1   Oct. 4, 2007

(30) Foreign Application Priority Data

Mar. 31, 2006   (KR) ...................... 10-2006-0029600

(51) Int. Cl.
*H01L 51/50* (2006.01)
*H01L 51/52* (2006.01)
(52) U.S. Cl. ........................ 313/503; 313/292; 313/506
(58) Field of Classification Search .......... 313/500–512
See application file for complete search history.

(56) References Cited

U.S. PATENT DOCUMENTS

2004/0140759 A1*  7/2004  Park et al. ................... 313/504

FOREIGN PATENT DOCUMENTS

JP   2000030858 A  *  1/2000
JP   2001230073 A  *  8/2001

* cited by examiner

*Primary Examiner*—Mariceli Santiago
(74) *Attorney, Agent, or Firm*—Ked & Associates LLP (57) ABSTRACT

An organic light emitting device is provided. The device may include a substrate having an emission region and a non-emission region, a sub-pixel formed on the substrate in the emission region of the substrate, and a sealant provided in the non-emission region that seals the emission region of the substrate. The sub-pixel may include a first electrode formed on the substrate in the emission region of the substrate, an emission portion formed on the first electrode, and a second electrode arranged on the emission portion. A barrier rib may be provided to partition the second electrode. A width of an end portion of the barrier rib may be narrower than a width of another portion of the barrier rib.

13 Claims, 8 Drawing Sheets

FIG. 1

(Related Art)

FIG. 2

(Related Art)

FIG. 3

(Related Art)

ORGANIC LIGHT EMITTING DISPLAY

CROSS-REFERENCE

This application claims priority to and the benefit of Korea Patent Application No. 10-2006-0029600, filed on Mar. 31, 2006, the entire content of which is incorporated herein by reference.

BACKGROUND

1. Field

The present invention relates to an organic light emitting display.

2. Related Art

In recent years, a flat panel display (FPD) increasingly becomes important with the development of multimedia. Hence, various flat panel displays such as a plasma display panel (PDP), a field emission display (FED), and an organic light emitting display (OLED) have been put to practical use.

In portionicular, an organic light emitting display has an advantage in that it has a high response speed lower than 1 ms and low consumption power, as well as emits light by itself. In addition, the organic light emitting display is advantageous as a motion image display medium because it does not have a trouble in the view angle without respect to its size. Furthermore, the organic light emitting display has come into the spotlight as a next generation flat panel display because it can be simply manufactured with existing semiconductor manufacturing processes at a low temperature.

Figure 1:
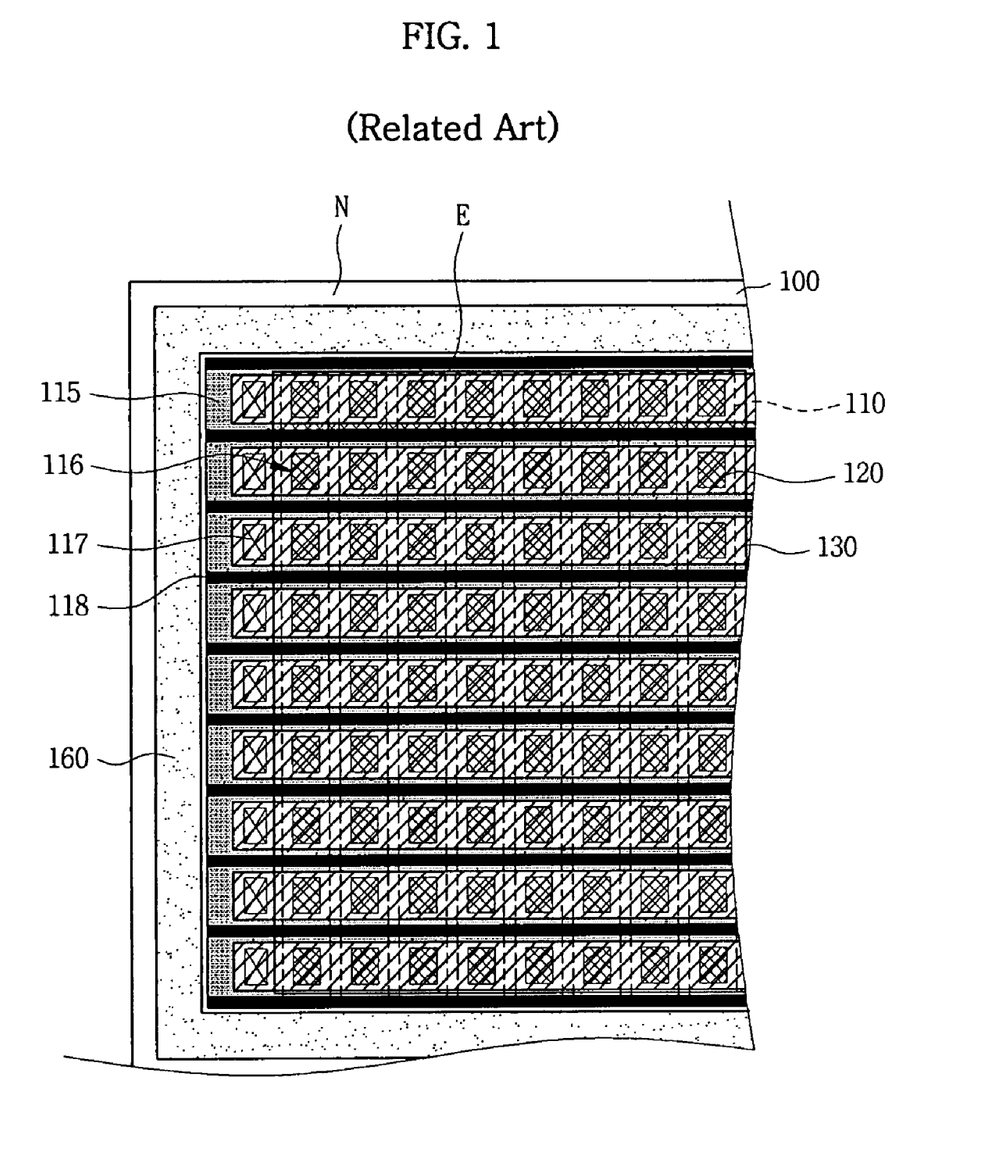
FIG. 1 is a plan view illustrating an organic light emitting display according to the prior art.
Figure 2:
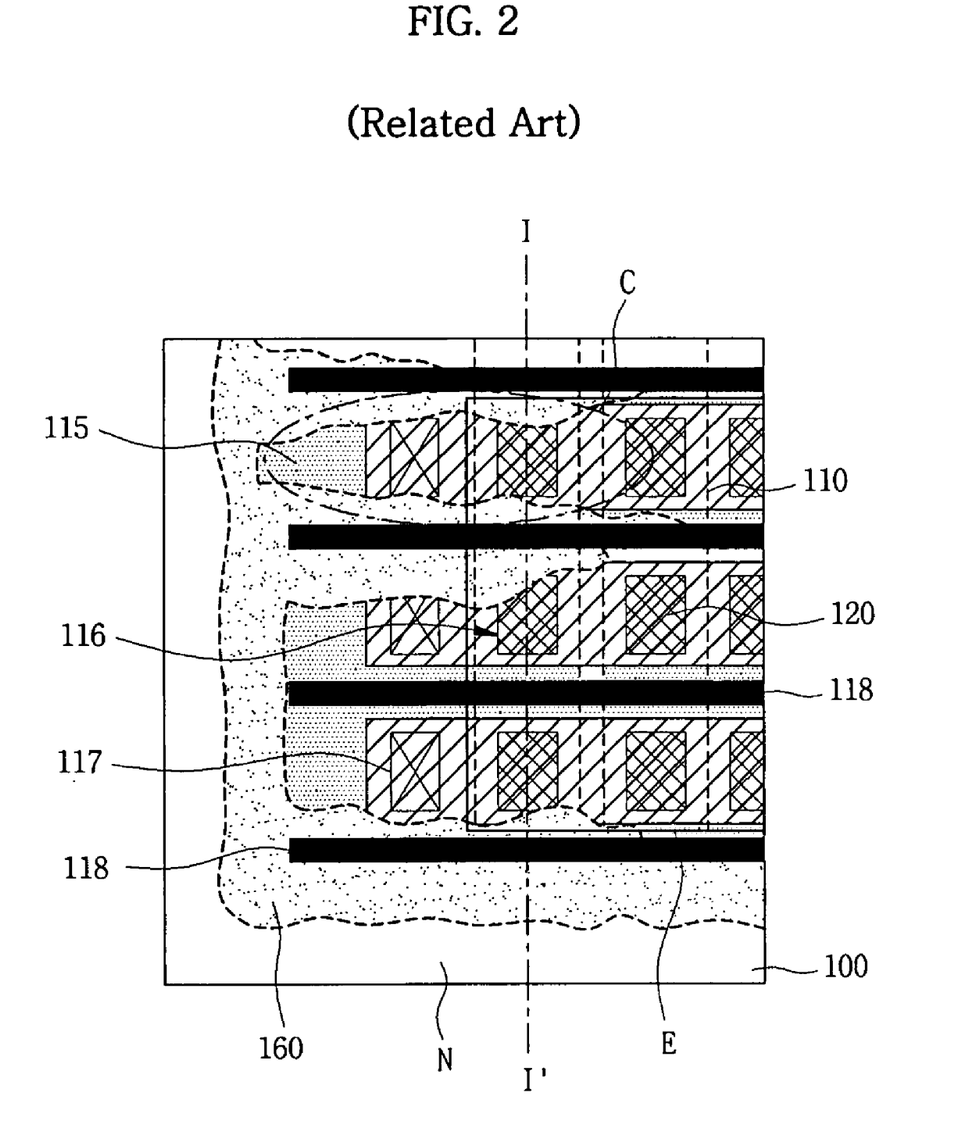
FIG. 2 is a portionially enlarged view of the organic light emitting display in FIG. 1.
Figure 3:
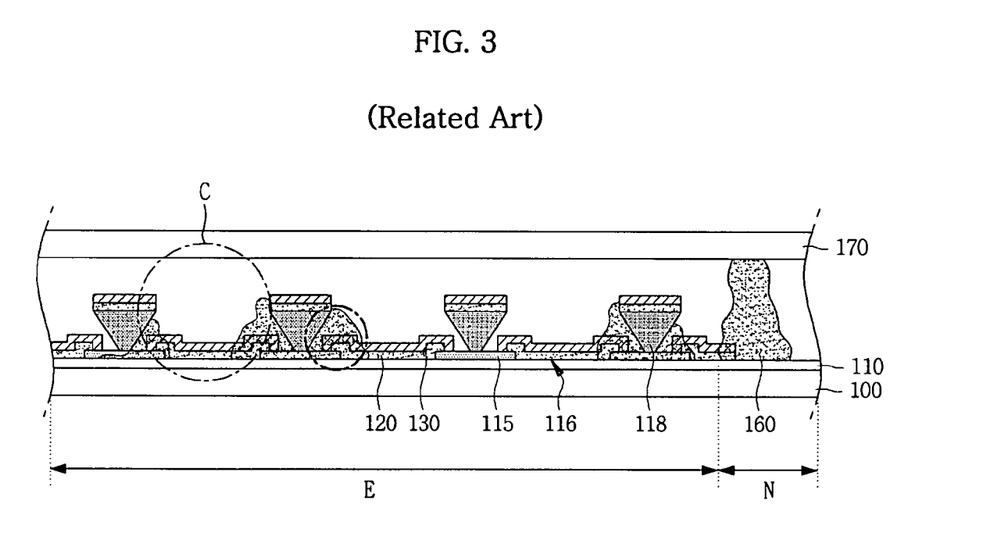
FIG. 3 is a cross sectional view of the organic light emitting display taken along line I-I' of FIG. 2.

FIG. 1 is a plan view illustrating a structure of an organic light emitting display according to the prior art, FIG. 2 is a portionially enlarged view of the organic light emitting display in FIG. 1, and FIG. 3 is a cross sectional view of the organic light emitting display taken along line I-I' of FIG. 2.

Referring to FIGS. 1 to 3, an organic light emitting display according to the prior art comprises a substrate 100 comprising a non-emission region N and an emission region E, on which there are arranged sub-pixels, each comprising a first electrode 110, an emission layer 120, and a second electrode 130. Here, a first region where sub-pixels are arranged is defined as an emission region E, and a second region other than the first region is defined as a non-emission region N.

On the non-emission region N of the substrate 100 there are provided sealant 160 and wires (not shown) to apply electrical signals to the first electrode 110 and the second electrode 130.

More specifically, the first electrode 110 is patterned on the substrate 100 in a stripe form. And, wires (not shown), which are spaced from the first electrode 110 and have the same material as the first electrode 110, are provided. On a portion of the first electrode 110 and wires (not shown) there is provided an insulating film 115 comprising an opening 116 for exposing a portion of the first electrode 110 and a contact portion 117 for exposing a portion of the wires (not shown). On the insulating film 115 there are provided barrier ribs 118 formed to be spaced from each other in the direction of intersecting the first electrode 110, and in the opening 116 there is provided the emission layer 120. The second electrode 130 is located on the substrate comprising the emission layer 120 and contact portion 117, and the second electrode 130 is patterned by the barrier ribs 118. And, the sealant 160 is provided on the non-emission region N of the substrate 100 to surround the emission region E. And, the substrate 100 provided with the sub-pixels is attached to an encapsulation substrate (not-shown) by the sealant 160 to protect the emission portion from external moisture or oxygen.

At this time, however, the sealant 160 can be flowed into the emission region E as shown in FIGS. 2 and 3(C). That is, a capillary phenomenon created by a pressure applied when the substrate 110 and the encapsulation substrate 170 are attached to each other causes the sealant 160 to flow into the emission region E along the lower space of barrier ribs having overhang structures.

The flowed sealant 160 may cause damage to an outer circumference of the emission layer 120, thereby to reduce reliability and emission efficiency of elements.

SUMMARY

Accordingly, the present invention is provided to substantially obviate one or more problems due to limitations and disadvantages of the related art.

To achieve the above objects, there is provided an organic light emitting device according to the present invention comprising: a first substrate comprising an emission region and a non-emission region; a sub-pixel located on the first substrate, the sub-pixel comprising a first electrode, an emission layer, and a second electrode; and a barrier rib located on the substrate comprising the first electrode, the barrier rib patterning the second electrode, wherein a volume per unit area of a portion of the barrier rib located on the non-emission region is different from that of the other portion of the barrier rib located on the emission region.

BRIEF DESCRIPTION OF THE DRAWINGS

FIG. 4 is a plan view illustrating a portion of a barrier rib of an organic light emitting display according to a first embodiment of the present invention.

DETAILED DESCRIPTION OF THE EMBODIMENTS

Figure 4:
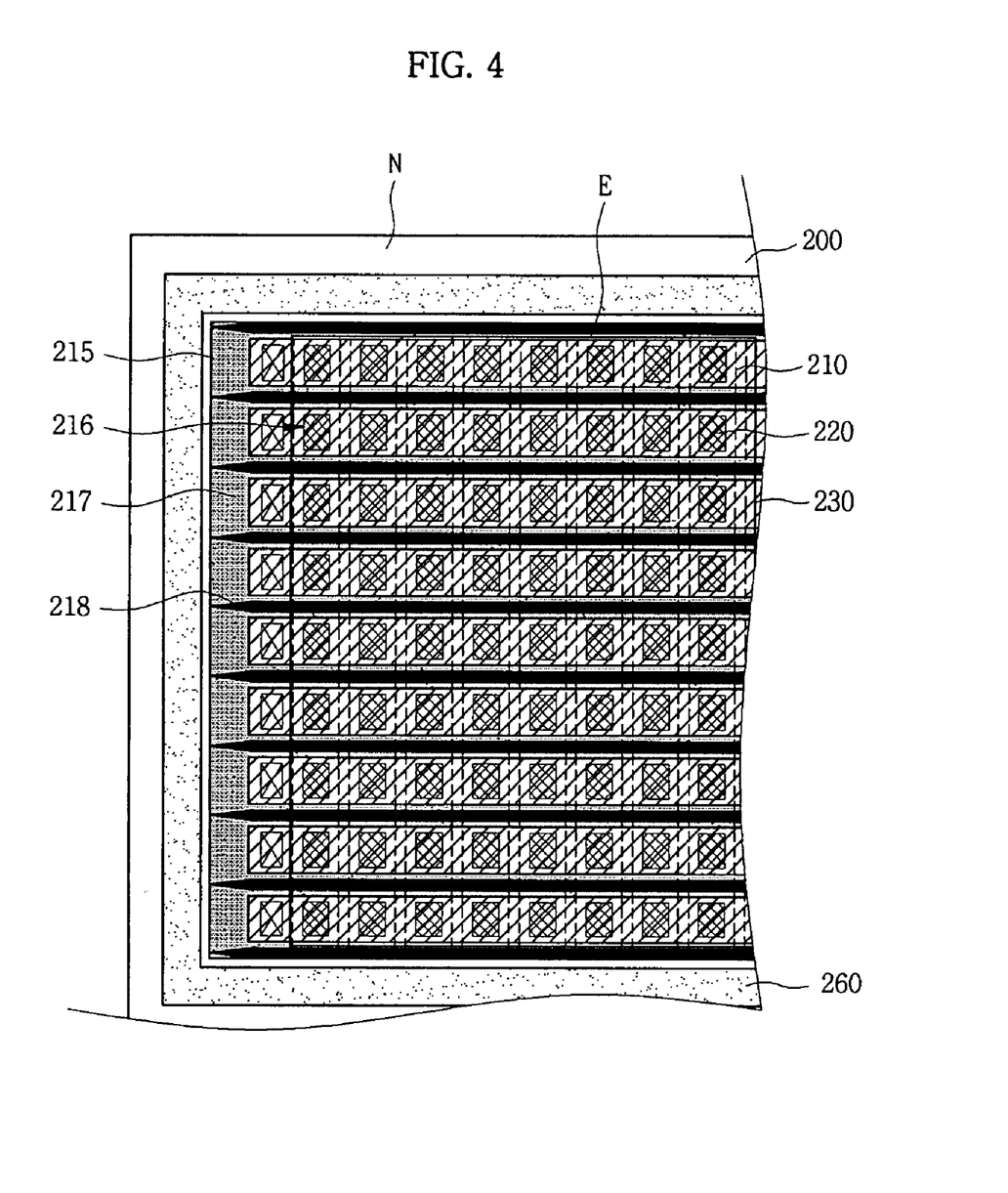
FIG. 4 is a plan view of an organic light emitting display according to a first embodiment of the present invention.
Figure 5:
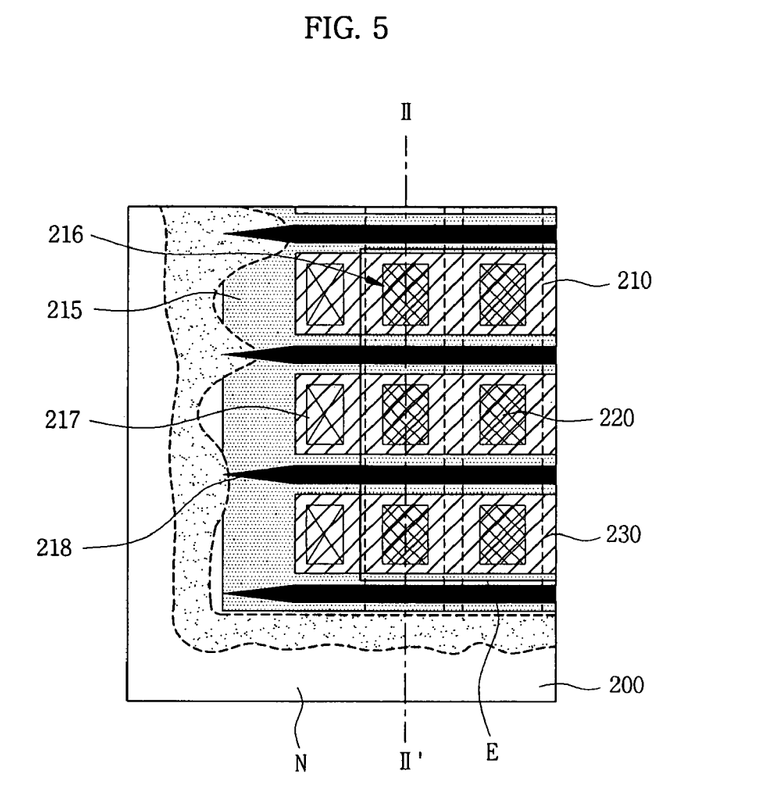
FIG. 5 is a portionially enlarged view of the organic light emitting display in FIG. 4.
Figure 6:
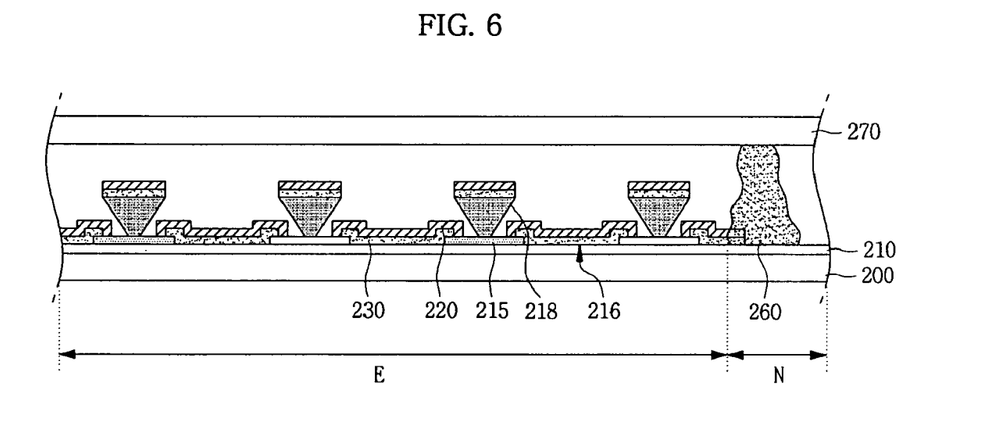
FIG. 6 is a cross sectional view of the organic light emitting display taken along line II-II' of FIG. 4.

Referring to FIGS. 4 to 6, an organic light emitting display comprises a substrate 200 comprising a non-emission region N and an emission region E, on which there are arranged sub-pixels, each comprising a first electrode 210, an emission layer 220, and a second electrode 230. On the non-emission region N of the substrate 200 there are provided sealant 260 and wires (not shown) to apply electrical signals to the first electrode 210 and the second electrode 230.

More specifically, the first electrode 210 is patterned on the substrate 200 in a stripe form. And, wires (not shown), which are spaced from the first electrode 210 and have the same material as the first electrode 210, are provided.

The first electrode 210 may be an anode and may comprise a transparent conductive layer having a high work function such as ITO (Indium Tin Oxide). And, the wires (not shown) may further comprise a metallic layer disposed on a transparent conductive film other than the transparent conductive layer.

An insulating film 215 is disposed on a portion of the first electrodes 210 and wires (not shown). The insulating film 215 may comprise an opening 216 for exposing a portion of the first electrode 210 and a contact portion 217 for exposing a portion of the wires (not shown). And, on the insulating film 215 there are disposed barrier ribs 218 formed in the direction of intersecting the first electrode 210. The barrier ribs 218 are formed to be spaced from each other. And, the width of a portion of a barrier rib 218 located on the non-emission region N may be narrower than that of a portion of a barrier rib 218 located on the emission region E.

Figure 7A:
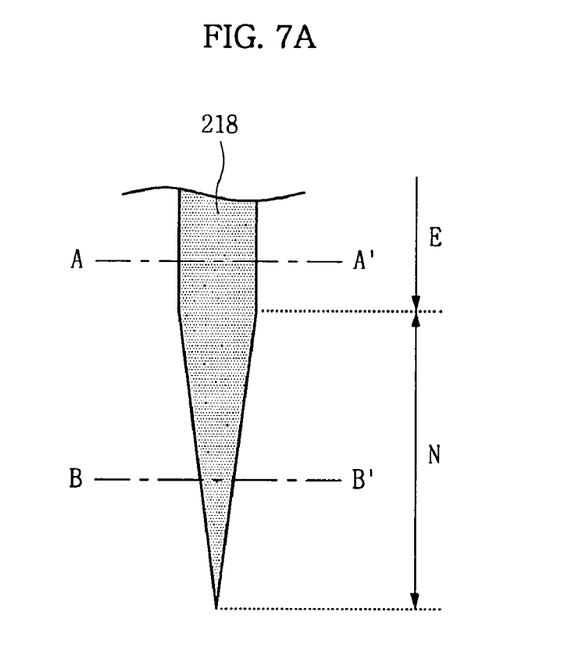
Figure 7B:
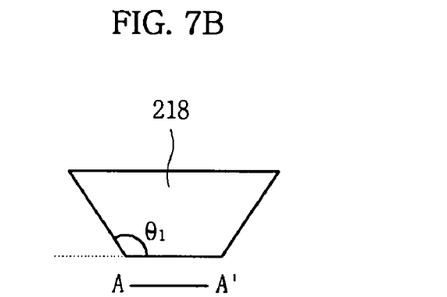
FIG. 7B is a cross sectional view of the barrier rib taken along line A-A' of FIG. 7A.
Figure 7C:
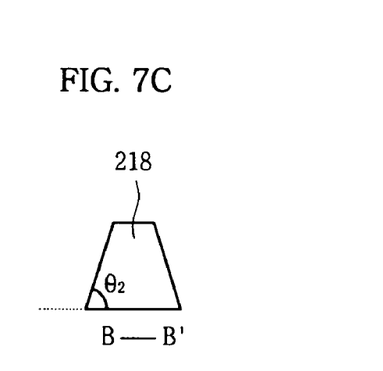
FIG. 7C is a cross sectional view of the barrier rib taken along line B-B' of FIG. 7A.

More specifically, the width of a portion of a barrier rib 218 located on the non-emission region N, i.e. the width of an end portion, may become narrower as it goes to the outer circumference of the substrate as shown in FIGS. 7A to 7C. At this time, it is desirable that the end portion of the barrier rib 218 located on the non-emission region N is formed to have a length of more than 0 μm and less than 100 μm.

A cross section of the end portion of the barrier rib 218 located on the emission region E, taken along the line A-A', may have a reverse taper shape so that the second electrode 230 may be patterned. That is, each (θ1) of two base angles at the cross section taken along the line A-A' may be greater than 90 degrees. And, a cross section of the end portion of the barrier rib 218 located on the non-emission region N, taken along the line B-B' may have a taper shape, and each θ2 of two base angles at the cross section taken along the line B-B' may be more than 10 degrees and less than 90 degrees.

The barrier rib 218 having the above-mentioned structure can be formed by selectively etching the end portion of the barrier rib located on the non-emission region N through a well known process such as lithography or sandblasting.

Returning to FIGS. 4 to 6, the sealant 260 is applied on a portion of the non-emission region, and the substrate 200 having the above-mentioned structure is attached to the encapsulation substrate 270 by the sealant 260.

At this time, the organic light emitting device according to a first embodiment of the present invention can reduce the phenomenon where the sealant 260 flows into the emission region as shown in FIGS. 5 and 6, since the width of the end portion of the barrier rib 218 located on the non-emission region N is formed to be narrower than that of the end portion of the barrier rib 218 located on the emission region E. That is, the organic light emitting device according to the embodiment of the present invention can reduce the phenomenon caused by a capillary phenomenon as in the prior art, where the sealant 260 flows into the emission region E, by making the width of the end portion of the barrier rib 218 located on the non-emission region N narrow to secure a space.

Figure 8:
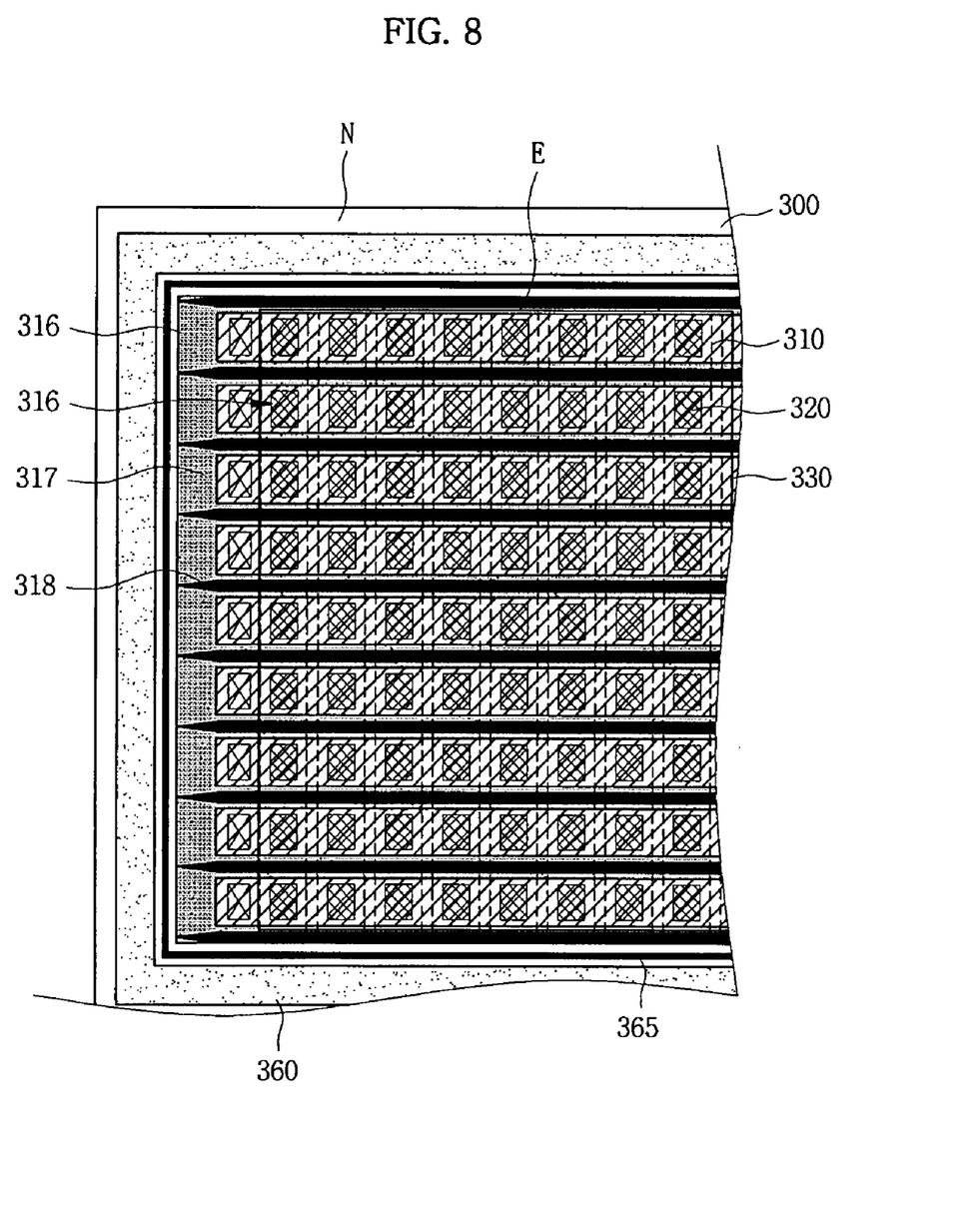
FIG. 8 is a plan view illustrating an organic light emitting display according to a second embodiment of the present invention.

FIG. 8 is a plan view illustrating an organic light emitting display according to a second embodiment of the present invention.

Referring to FIG. 8, the organic light emitting display according to the second embodiment of the present invention, has the same construction as the first embodiment of the present invention except that a barrier 365 is further provided between the barrier rib 318 and sealant 360.

That is, on a substrate 300 according to the second embodiment of the present invention there are located a first electrode 310 patterned in a stripe form and wires (not shown), and on a portion of the first electrode 310 and wires there is provided an insulating film 315 comprising an opening 316 for exposing a portion of the first electrode 310 and a contact portion 317 for exposing a portion of the wires (not shown). And, on the insulating film 315 there are disposed barrier ribs 318 formed to be spaced from each other in the direction of intersecting the first electrode 310, where the width of a barrier rib 318 located on the non-emission region N may be narrower than that of a barrier rib 318 located on the emission region E.

And, a barrier 365 may be disposed between the emission region E and sealant 360. The barrier 365 of the organic light emitting display according to the second embodiment of the present invention can be formed in one or more layers, and prevent the sealant 360 from flowing into the emission region E. The location where the barrier 365 is to be formed may be selected depending on how much sealant 360 is flowed into the emission region E.

That is, the organic light emitting display according to the second embodiment of the present invention can prevent sealant 360 from flowing into the emission region when the substrate 300 and the encapsulation substrate 370 are attached to each other, primarily by the barrier and secondarily by the barrier rib 318.

Therefore, the organic light emitting display according to the second embodiment of the present invention can prevent more efficiently sealant from flowing into the emission region compared to the organic light emitting display according to the first embodiment of the present invention.

Figure 9:
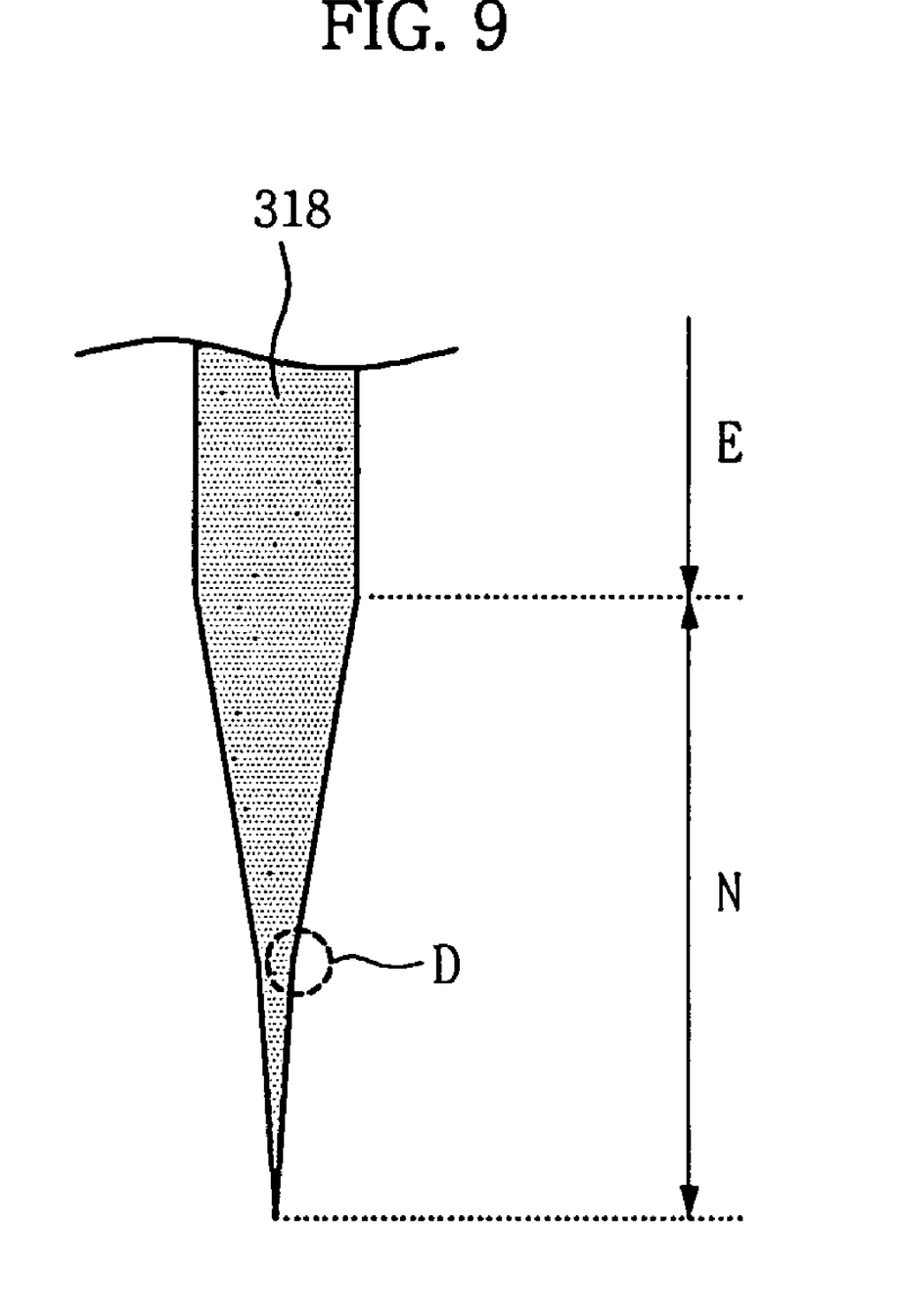
FIG. 9 is a cross sectional view of a barrier rib of the organic light emitting display according to the second embodiment of the present invention.

FIG. 9 is a plan view illustrating a structure of a barrier rib according to the second embodiment of the present invention.

Referring to FIG. 9, a portion of the barrier rib according to the second embodiment, which is located on the non-emission region, has narrower width than the other portion thereof, which is located on the emission region, and the portion of the barrier rib which is located on the emission region becomes narrower in width as going to the outer circumference of the substrate and has a bent where the width decreases sharply.

Accordingly, the organic light emitting display according to the second embodiment of the present invention can reduce dramatically a capillary phenomenon since the width of the end portion of the barrier rib located on the non-emission region decreases prominently compared to the barrier rib according to the first embodiment of the present invention. As a consequence, the barrier rib according to the second embodiment can prevent the inflow of sealant effectively.

While the above-mentioned embodiments illustrate a case where the width of a portion of the barrier rib located on the non-emission region is narrower than that of the other portion of the barrier rib located on the emission region, the structure of the barrier rib is not limited thereto, and therefore the height of a portion of the barrier rib located on the non-emission region may be lower than that of the other portion of the barrier rib located on the emission region. And, both of height and width of the portion of the barrier rib located on the non-emission region may be adjusted at the same time.

In addition, while the barrier ribs according to the embodiments of the present invention have been described to be formed by photolithography or sandblasting, but not limited thereto, various processes can be applicable to form the barrier ribs.

And, while the barrier ribs according to the embodiments of the present invention have been described to be formed in a singe layer, they can also be formed in a double layer.

What is claimed is:

1. An organic light emitting display, comprising:
   a first electrode arranged on a substrate;
   an emission portion formed on the first electrode;
   a second electrode arranged on the emission portion;
   a barrier rib partitioning the second electrode, the barrier rib formed so that an end portion of the barrier rib has a narrower width than another portion of the barrier rib; and
   a sealant formed to seal the emission portion.

2. The organic light emitting display of claim 1, wherein the end portion of the barrier rib has a lower height than the another portion of the barrier rib.

3. The organic light emitting display of claim 1, further comprising a barrier partitioning the barrier rib from the sealant.

4. The organic light emitting display of claim 1, wherein a length of the end portion of the barrier rib is 100 µm or less.

5. The organic light emitting display of claim 1, wherein the emission portion includes an organic light emitting layer.

6. The organic light emitting display of claim 1, wherein a cross section of the end portion of the barrier rib taken in a height direction thereof has an exterior angle slope of 90 degrees or more.

7. The organic light emitting display of claim 2, further comprising a barrier that partitions the barrier rib from the sealant.

8. The organic light emitting display of claim 2, wherein a length of the end portion of the barrier rib is 100 µm or less.

9. The organic light emitting display of claim 2, wherein the emission portion includes an organic light emitting layer.

10. The organic light emitting display of claim 2, wherein a cross section of the end portion of the barrier rib taken in a height direction thereof has an exterior angle slope of 90 degrees or more.

11. The organic light emitting display of claim 6, further comprising a barrier that partitions the barrier rib from the sealant.

12. The organic light emitting display of claim 6, wherein a length of the end portion of the barrier rib is 100 µm or less.

13. The organic light emitting display of claim 6, wherein the emission portion includes an organic light emitting layer.

* * * * *